(12) United States Patent
Nagayama et al.

(10) Patent No.: US 7,892,361 B2
(45) Date of Patent: Feb. 22, 2011

(54) IN-CHAMBER MEMBER, A CLEANING METHOD THEREFOR AND A PLASMA PROCESSING APPARATUS

(75) Inventors: Nobuyuki Nagayama, Yamanashi (JP); Kouji Mitsuhashi, Yamanashi (JP); Hiroyuki Nakayama, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 258 days.

(21) Appl. No.: 12/061,488

(22) Filed: Apr. 2, 2008

(65) Prior Publication Data

US 2008/0196744 A1 Aug. 21, 2008

Related U.S. Application Data

(62) Division of application No. 10/477,233, filed as application No. PCT/JP02/03333 on Apr. 3, 2002, now abandoned.

(30) Foreign Application Priority Data

May 9, 2001 (JP) ............................. 2001-138383

(51) Int. Cl.
*B08B 7/04* (2006.01)
*B08B 3/00* (2006.01)

(52) U.S. Cl. ................................ 134/26; 134/1.1; 134/4

(58) Field of Classification Search ..................... 134/1, 134/1.1, 1.3, 1.2, 26, 30, 4; 438/905, 543; 156/345.1, 345.3
See application file for complete search history.

(56) References Cited

U.S. PATENT DOCUMENTS

| 5,486,235 A | 1/1996 | Ye et al. |
| 5,753,137 A | 5/1998 | Ye et al. |
| 6,147,010 A * | 11/2000 | Whitman .................... 438/782 |
| 6,258,728 B1 | 7/2001 | Donohoe et al. |
| 6,322,716 B1 * | 11/2001 | Qiao et al. .................... 216/67 |
| 6,762,132 B1 * | 7/2004 | Yates ......................... 438/745 |

FOREIGN PATENT DOCUMENTS

| JP | 52-142970 | 11/1977 |
| JP | 61-166030 | 7/1986 |
| JP | 4-313223 | 11/1992 |
| JP | 9-186137 | 7/1997 |

* cited by examiner

*Primary Examiner*—Alexander Markoff
(74) *Attorney, Agent, or Firm*—Oblon, Spivak, McClelland, Maier & Neustadt, L.L.P.

(57) ABSTRACT

An in-chamber member to use in the chamber of a plasma processing vessel has a coating film formed by a coating agent. The in-chamber member having deposits formed on the coating film is separated from the chamber and is immersed into a peeling solvent, e.g., acetone. Since the coating agent is made of a resist formed of a main component of, e.g., cyclized rubber-bisazide and a photosensitive component, the deposits can be separated from the in-chamber member together with the coating film being separated.

10 Claims, 3 Drawing Sheets

IN-CHAMBER MEMBER, A CLEANING METHOD THEREFOR AND A PLASMA PROCESSING APPARATUS

The present application is a divisional of the application Ser. No. 10/477,233, filed Nov. 10, 2003, now abandoned.

FIELD OF THE INVENTION

The present invention relates to a coating agent, a plasma-resistant member having a coating film formed by the coating agent and a plasma processing apparatus equipped with the plasma-resistant member; and more particularly, to a coating agent used in a plasma-resistant member installed inside a chamber of a plasma processing apparatus in which plasma is excited to carry out a micro patterning process on a surface of an object to be processed, a plasma-resistant member coated with the coating agent and a plasma processing apparatus equipped with the plasma-resistant member.

BACKGROUND OF THE INVENTION

In a semiconductor manufacturing process, a micro patterning process has conventionally been performed on a surface of an object to be processed such as a semiconductor wafer by means of, e.g., a plasma etching apparatus.

In such a plasma etching apparatus, an upper and a lower electrode are installed to face each other in an airtight chamber of a plasma processing vessel thereof. Mounted on the lower electrode is the object to be processed. When high frequency electric powers are applied to the upper electrode and the lower electrode, a glow discharge is induced therebetween. A process gas supplied into the chamber of the plasma processing vessel is converted into plasma by the glow discharge, which enables the object to be patterned by the plasma etching. As the process gas, a CF(Fluorocarbon)-based gas has been widely used.

The plasma processing vessel of the plasma etching apparatus is made of alumite treated Al (aluminum) employed as a base material. Further, ceramic members made of sintered $Al_2O_3$ (alumina) are detachably mounted on an entire inner surface of the chamber.

That is, the plasma processing vessel used in the prior art plasma etching apparatus includes an outer wall portion made of Al and an inner wall portion made of the ceramic material of $Al_2O_3$ (alumina), the inner wall portion being detachably mounted on the inner surface of the outer wall. Therefore, even in a case where the inner wall portion of the plasma processing vessel is abraded and damaged by plasma, restoration can be achieved by simply replacing the inner wall portion with a new one.

Further, in order to perform a desired etching process on the object in the prior art plasma etching apparatus by effectively confining the plasma between the upper electrode and the lower electrode, plasma-resistant members such as a focus ring, a discharge ring and the like (referred to as in-chamber members hereinafter) are disposed at predetermined positions around the upper and the lower electrode.

In case of the above-described conventional plasma etching apparatus employing a CF-based gas as a main process gas, however, reaction by-products (CF-based polymers) of the plasma process are deposited on the inner wall of the chamber. The by-products deposited for a certain period of time are separated and dispersed to become foreign substances. In order to prevent the foreign substances from being generated, the in-chamber members are periodically cleaned by wet cleaning.

FIGS. 3A to 3D show views setting forth a cleaning process of a conventional in-chamber member. Specifically, FIG. 3A depicts a view illustrating a state before CF-based polymer particles are deposited on the in-chamber member; 3B presents a view illustrating a state after the CF-based polymer particles are deposited on the in-chamber member; FIG. 3C represents the in-chamber member after cleaning; and FIG. 3D offers a view illustrating a physical removing process of residual CF-based polymer particles.

When the etching process is performed in the chamber of the plasma etching apparatus, an in-chamber member 60 undergoes a change from the state where the CF-based polymer particles are not deposited thereon as shown in FIG. 3A to the state where the CF-based polymer particles are deposited thereon as shown in FIG. 3B, i.e., a deposition state. When such a state is reached, the periodic cleaning work is performed. The periodic cleaning is carried out by immersing the in-chamber member 60 in a cleaning fluid or a peeling solvent. By only immersing the in-chamber member 60 in the cleaning fluid or the like, however, deposits 61 cannot be completely removed from the in-chamber member 60 and a portion thereof remains as shown in FIG. 3C. For this reason, it is required to physically remove the residues, e.g., by using a scoop as shown in FIG. 3D or by blast.

However, in case where the residues are removed by the above-explained physical method, the number of processes of the periodic cleaning work increases to that extent, which in turn increases the time and the cost required for the cleaning work. Furthermore, there may arise a problem that the in-chamber member 60 is physically damaged. For this reason, it may be considered to use rather stronger cleaning fluid and peeling solvent to avoid employing the physical method for removing the residues. In this case, however, there may arise another problem that the in-chamber member 60 is chemically damaged, e.g., corroded, due to the cleaning fluid and the like capable of completely eliminating the residues.

SUMMARY OF THE INVENTION

It is, therefore, an object of the present invention to provide a coating agent for forming a coating film on a plasma-resistant member in a chamber of a plasma processing apparatus, the plasma-resistant member coated with the coating film and the plasma processing apparatus equipped with the plasma-resistant member, wherein the coating film serves to prevent damages due to plasma and can be easily removed during maintenance.

In order to achieve the object, the present invention includes a coating agent for forming a coating film on the plasma-resistant member to use in the chamber of a plasma processing apparatus, wherein the coating agent is made of a resist which can be dissolved by an organic solvent.

Since the coating agent is made of the resist, it is easily dissolved by the organic solvent. Accordingly, by forming a coating film made of the coating agent on the plasma-resistant member, damages due to plasma can be prevented and the coating film can be easily removed from the plasma-resistant member by the organic solvent. Furthermore, since the coating agent is made of the resist, there is no possibility for the coating film to adversely affect an object to be processed in the plasma processing apparatus.

Preferably, the resist includes a main component and a photosensitive component, the main component being selected from the group consisting of cyclized rubber-bisazide, vinyl polycinnamate, naphthalene compound, phenolic resin, acrylic resin and novolac resin.

More preferably, the coating agent is made of a rest part of the resist except for the photosensitive component.

In case of the coating agent, since the photosensitive component is excluded from the resist, the cost for the coating agent can be reduced by as much as the cost for the photosensitive component.

In order to attain the aforementioned object, the present invention includes a plasma-resistant member to use in the chamber of a plasma processing apparatus, the plasma-resistant member having a coating film formed by the coating agent recited in any one of claims 1 to 3.

Since the coating film, which is made by the coating agent in any one of claims 1 to 3, is formed on the plasma-resistant member, the coating film can be easily removed from the plasma-resistant member by being dissolved by the organic solvent.

In order to achieve the above-described object, the present invention includes a coating agent, a plasma processing apparatus for exciting plasma in a chamber so as to perform a micro patterning process on a surface of an object to be processed, the chamber accommodating therein the plasma-resistant member described in claim 4.

Since this plasma processing apparatus includes the plasma-resistant member described in claim 4, it is possible to prevent damages due to plasma by means of the coating film, while it is easy to remove the coating film from the plasma-resistant member by using an organic solvent during maintenance.

BRIEF DESCRIPTION OF THE DRAWINGS

FIGS. 2A to 2E present views setting forth states of a plasma-resistant member installed in the plasma processing apparatus shown in FIG. 1 and a coating film of the plasma-resistant member, wherein FIG. 2A depicts the plasma-resistant member before the coating agent in accordance with the preferred embodiment of the invention is applied thereon; FIG. 2B offers the plasma-resistant member having a coating film formed by applying the coating agent thereon; FIG. 2C shows a state of the plasma-resistant member having deposits accumulated on the coating film; FIG. 2D represents a state of separating the coating film from the plasma-resistant member shown in FIG. 2C; and FIG. 2E presents a state where the coating film is completely removed from the plasma-resistant member; and FIG. 3A to 3D offer views setting forth a cleaning work of a conventional plasma-resistant member, wherein FIG. 3A depicts a view illustrating a state before CF-based polymer particles are deposited on the conventional plasma-resistant member; FIG. 3B presents a view illustrating a state after the CF-based polymer particles are deposited thereon; FIG. 3C represents a state of the conventional plasma-resistant member after the cleaning work; and FIG. 3D offers a view illustrating a physical removing process of residual CF-based polymer particles.

DETAILED DESCRIPTION OF PREFERRED EMBODIMENTS

Hereinafter, a plasma processing apparatus and a coating agent in accordance with a preferred embodiment of the present invention will be described in detail with reference to the accompanying drawings, the plasma processing apparatus being equipped with plasma-resistant members having a coating film formed by the coating agent.

Figure 1:
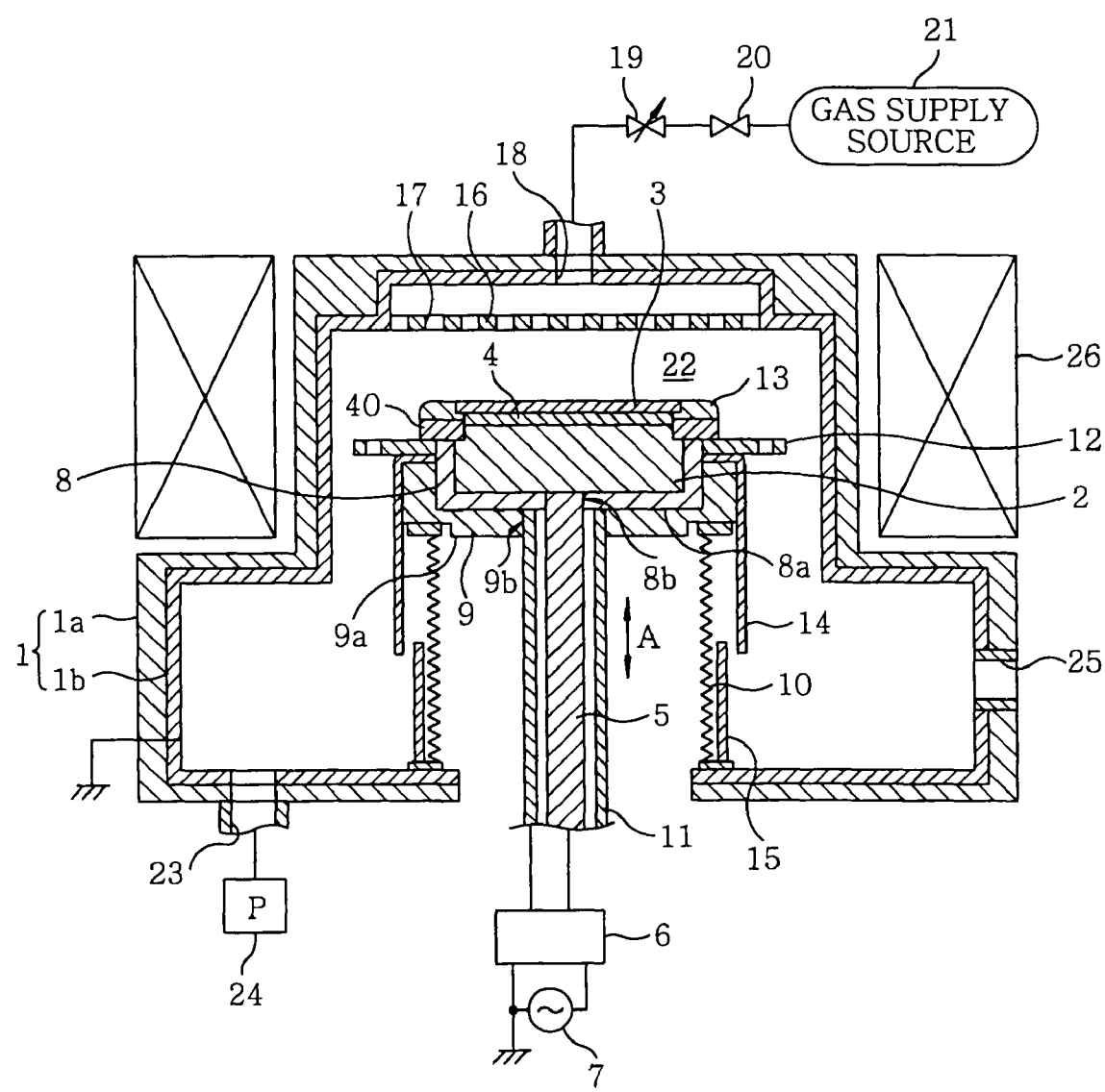
FIG. 1 shows an internal structure of a plasma processing apparatus equipped with plasma-resistant members formed by a coating agent in accordance with a preferred embodiment of the present invention.

FIG. 1 shows an internal structure of the plasma processing apparatus equipped with plasma-resistant member formed by a coating agent in accordance with the present invention.

A plasma processing vessel 1 of the plasma processing apparatus includes an outer wall 1a made of alumite treated Al and an inner wall 1b formed by a ceramic member made of $Al_2O_3$, the ceramic member being detachably provided on an entire inner surface of the outer wall 1a. By being surrounded with the inner wall 1b, an airtightly sealed chamber 22 (inside of the plasma processing vessel) is formed. In the chamber 22, an etching process is performed on a semiconductor wafer which will be described later.

In the chamber 22, in-chamber members (plasma-resistant members), e.g., an electrode protection member 8, a discharge ring 12, a focus ring 13, an insulation ring 40, a first and a second bellows cover 14, 15 and the like, exposed to the plasma environment are installed at their respective positions.

Disposed in the plasma processing vessel 1 is a lower electrode 2 made of a conductive material. Mounted on a top surface of the lower electrode 2 is an electrostatic chuck 4 for adsorbing and maintaining a semiconductor wafer 3 to be processed.

A bottom surface and a peripheral surface of the lower electrode 2 are protected by the electrode protection member 8 which is one of the in-chamber members. A lower surface 8a and a peripheral surface of the electrode protection member 8 are covered by a conductive member 9. The conductive member 9 has an opening 9b at a central portion of its lower surface 9a. Formed at a central portion of the lower surface 8a of the electrode protection member 8 exposed through the opening 9b is an opening 8b having an opening area smaller than that of the opening 9b of the conductive member 9. The opening 9b is provided with a tube-shaped member 11 passing therethrough, a leading end thereof being fixed at the lower surface 8a of the electrode protection member 8. The tube-shaped member 11 is made of a conductive material, e.g., oxidized Al. The tube-shaped member 11 has an opening area larger than that of the opening 8b and the leading end surrounds the opening 8b. An elevating shaft 5 is inserted into and passes through both of the tube-shaped member 11 and the opening 8b of the electrode protection member 8. The elevating shaft 5 is movable in a direction indicated by an arrow "A" and a leading end thereof is directly fixed to the bottom surface of the lower electrode 2. The lower electrode 2 is supported by the elevating shaft 5. The elevating shaft 5 is connected to a high frequency power source 7 via a matching unit 6 and serves as a power supply rod. Interposed between the conductive member 9 and a bottom surface of the plasma processing vessel 1 is a flexible bellows 10 made of a conductive material, e.g., stainless steel.

The discharge ring 12 is fixedly fitted around the peripheral surface of the electrode protection member 8 in a flange shape. The focus ring 13 and the insulation ring 40 are interposed between one end of the electrode protection member 8 and a peripheral surface of the electrostatic chuck 4. Further, installed at a lower surface of the discharge ring 12 is a first bellows cover 14 extending downward and erected upward at a bottom surface of the plasma processing vessel 1 is a second bellows cover 15 in such a manner that it overlaps with a portion of the first bellows cover 14.

Disposed at an upper part of the plasma processing vessel 1 is an upper electrode 16 made of a conductive material facing toward the lower electrode 2. The upper electrode 16 is provided with a plurality of gas discharge through-holes 17. A top surface of the plasma processing vessel 1 is provided with a gas supply inlet 18, which is connected to a gas supply source 21 via a mass flow controller 19 and an opening and closing valve 20. A process gas including a CF(fluorocarbon)-based gas is supplied from the gas supply source 21. Accordingly, the process gas from the gas supply source 21 is fed to the gas supply inlet 18 through the opening and closing valve 20 and the mass flow controller 19 and then is introduced into the chamber 22 via the gas discharge throughholes 17.

Provided through bottom surface of the plasma processing vessel 1 is a gas exhaust outlet 23 for exhausting the process gas, the gas exhaust outlet 23 being connected to a vacuum pump 24. In addition, an object transferring port 25 is provided through a lower side wall of the plasma processing vessel 1. The object transferring port 25 is an opening for loading the semiconductor wafer 3 to be processed into the chamber 22 or unloading the processed semiconductor wafer 3 from the chamber 22 therethrough.

Disposed around an outer circumference of the plasma processing vessel 1 is a permanent magnet 26 for generating a magnetic field along a direction parallel to a to-be-processed surface of the semiconductor wafer 3 adsorbed to the electrostatic chuck 4.

In the plasma processing apparatus having such a construction, the position of the semiconductor wafer 3 is controlled by moving the elevating shaft 5 in the direction indicated by the arrow "A" by means of a driving device (not shown). When a high frequency power of, e.g., 13.56 MHz is applied to the lower electrode 2 from the high frequency power source 7 via the elevating shaft 5, the glow discharge is generated between the lower electrode 2 and the upper electrode 16 to thereby develop an orthogonal electromagnetic field wherein an electric field and a magnetic field are orthogonal to each other.

When the chamber 22 is evacuated to a predetermined vacuum atmosphere by the vacuum pump 24 and the process gas from the gas supply source 21 is fed to the chamber 22 via the gas supply inlet 18, the process gas is converted into plasma. Subsequently, the desired micro patterning process is performed on the masked to-be-processed surface of the semiconductor wafer 3. At this time, the reaction by-products of the semiconductor wafer 3 and the CF-based gas, decomposed components and radicals of the CF-based gas generated by the plasma, and the like are produced and solid particles thereof are dispersed to be absorbed and deposited on surfaces of the in-chamber members, so that the so-called deposits are accumulated on the surfaces of the in-chamber members.

Figure 2A:
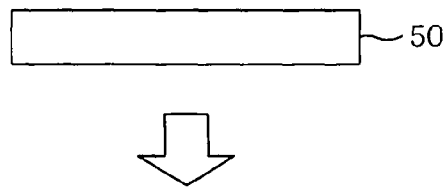
Figure 2B:
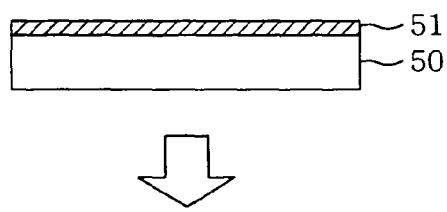
Figure 2C:
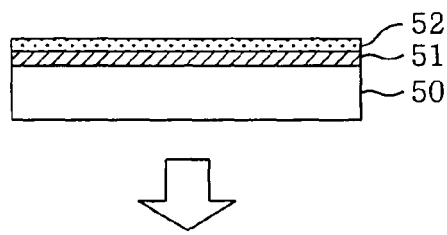
Figure 2D:
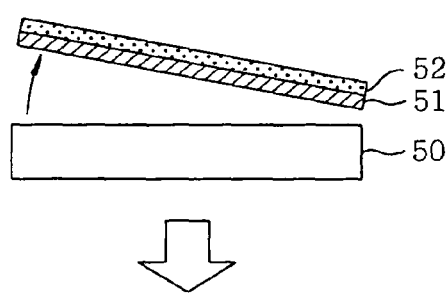
Figure 2E:
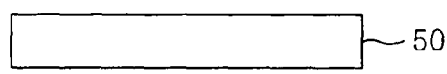
Figure 3A:
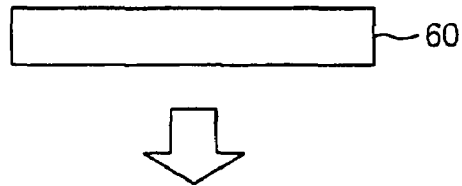
Figure 3B:
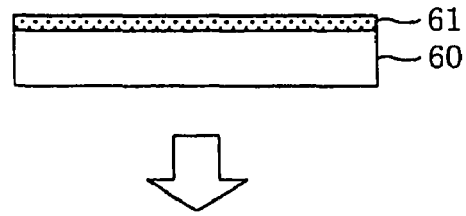
Figure 3C:
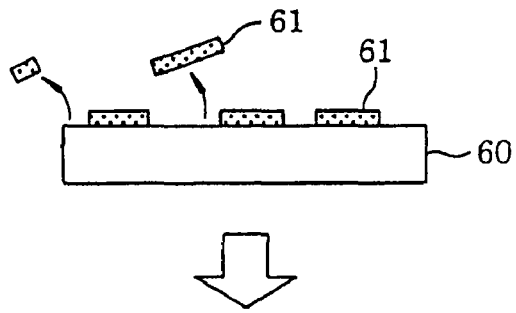
Figure 3D:
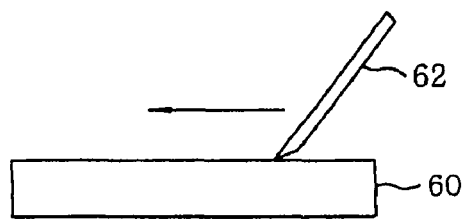

FIGS. 2A to 2E present views setting forth states of a plasma-resistant member installed in the plasma processing apparatus shown in FIG. 1 and a coating film of the plasma-resistant member, wherein FIG. 2A depicts the plasma-resistant member before the coating agent in accordance with the preferred embodiment of the present invention is coated thereon; FIG. 2B offers the plasma-resistant member where the coating film is formed by applying the coating agent; FIG. 2C presents a state of the plasma-resistant member in which deposits are accumulated on the coating film; FIG. 2D represents a state of separating the coating film from the plasma-resistant member shown in FIG. 2C; and FIG. 2E shows a state where the coating film is completely removed from the plasma-resistant member.

In FIG. 2A, there is deposited an in-chamber member 50 after the periodic cleaning work. Deposits of $AlF_3$ particles are not left on the in-chamber member 50. As shown in FIG. 2B, a coating agent 51 is applied on the in-chamber member 50. It is not necessary to apply the coating agent 51 on an entire in-chamber member 50. The coating agent 51 may be applied only on a certain portion thereof on which the deposits will be produced. The source material of the coating agent 51 is a resist used for patterning a semiconductor wafer. After the coating agent 51 is applied on the in-chamber member 50, it is dried to form a coating film (a resist film) thereon.

Next, a main component and a photosensitive component of the resist and an organic solvent for the dissolution thereof will be exemplified. Cyclized rubber-bisazide, vinyl polycinnamate, naphthalene compound, phenolic resin, acrylic resin, novolac resin and the like may be exemplified as the main component. Diazo naphthoquinone compound, aromatic bisazide and the like can be examples of the photosensitive component. The organic solvent may be exemplified by ethyl lactate, ethyl pyruvate, xylene and the like.

When the etching process is performed in the plasma processing vessel 1, the deposits 52 are accumulated on the coating film of the coating agent 51 formed on the in-chamber member 50 as shown in FIG. 2C. When the in-chamber member 50 is cleaned by, e.g., the periodic cleaning work, the in-chamber member 50 disassembled from the chamber 22 is immersed in a peeling solvent. The peeling solvent is an organic solvent such as aceton, thinner, alcohols and the like. When the in-chamber member 50 is immersed in the peeling solvent, since the coating agent 51 is dissolved by the peeling solvent, the deposits 52 attached to the coating film of the coating agent 51 are separated from the in-chamber member 50 together with the coating film as shown in FIG. 2D. When the coating film of the coating agent 51 is separated from the in-chamber member 50, the in-chamber member 50 becomes completely clean as shown in FIG. 2E.

As described above, in accordance with the preferred embodiment of the present invention, since the coating film of the coating agent 51 formed on the in-chamber member 50 can be completely separated by immersing same in the organic solvent, e.g., acetone, thinner, alcohol and the like, it becomes very convenient. Moreover, since acetone and the like do not inflict any damage on pure aluminum, the in-chamber member 50 can be used without any concern for being damaged.

Alternatively, in lieu of the above-explained resist, a rest part of the resist excluding the photosensitive component therefrom may be used as a coating agent, which facilitates treatment of the coating agent and at the same time reduces the coat therefor.

INDUSTRIAL APPLICABILITY

As described above, since the coating agent in accordance with the present invention is made of the resist capable being dissolved by the organic solvent, the coating film formed thereof is dissolved by the organic solvent as well, so that the coating film can be easily separated from the plasma-resistant member.

Further, by using the coating agent made of a rest part of the resist except for the photosensitive component, it is possible to reduce the cost for the coating agent by as much as the cost for the photosensitive component.

Moreover, since the plasma-resistant member in accordance with the present invention is coated with the coating film formed by the inventive coating agent, the coating film can be dissolved by the organic solvent and thus can be easily separated from the plasma-resistant member.

Further, in accordance with the inventive plasma processing apparatus, the plasma-resistant member is prevented from getting damaged by employing the coating film thereon, and moreover, when repaired, it is possible to easily remove the coating film from the plasma-resistant member by means of the organic solvent.

What is claimed is:

1. A method for cleaning an in-chamber member disposed in a chamber to which reaction by-products produced by a plasma process carried out in the chamber are attached, the method comprising:

forming in advance a coating film made of a resist on a surface of the in-chamber member;
    loading a semiconductor wafer to be processed into the chamber;
    processing the semiconductor wafer by performing the plasma process thereon in the chamber;
    unloading the processed semiconductor wafer from the chamber;
    after performing the plasma process, unloading the in-chamber member from the chamber; and
    immersing the unloaded in-chamber member into a peeling solvent to thereby remove the reaction by-products attached to the coating film from the in-chamber member together with the coating film that is being separated.

2. A method of claim 1, wherein the forming in advance the coating film on the surface of the in-chamber member includes:

applying a coating agent on the surface of the in-chamber member; and
    drying the coating agent on the surface of the in-chamber member to form the coating film thereon.

3. The method of claim 1, wherein the in-chamber member is a plasma-resistant member.

4. The method of claim 3, wherein the plasma-resistant in-chamber member includes at least one of an electrode protection member, a discharge ring, a focus ring, an insulation ring and a bellows cover.

5. The method of claim 1, wherein the resist includes a main component selected from the group consisting of a cyclized rubber-bisazide, a vinyl polycinnamate, a naphthalene compound, a phenolic resin, an acrylic resin, a novolac resin and mixtures thereof.

6. A method for cleaning an in-chamber member disposed in a chamber to which reaction by-products produced by a plasma process carried out in the chamber are attached, the method comprising:

forming in advance a coating film on a surface of the in-chamber member, the coating film being made of a rest part of a resist excepting for a photosensitive component;
    loading a semiconductor wafer to be processed into the chamber;
    processing the semiconductor wafer by performing the plasma process thereon in the chamber;
    unloading the processed semiconductor wafer from the chamber;
    after performing the plasma process, unloading the in-chamber member from the chamber; and
    immersing the unloaded in-chamber member into a peeling solvent to thereby remove the reaction by-products attached to the coating film from the in-chamber member together with the coating film that is being separated.

7. A method of claim 6, wherein the forming in advance the coating film on the surface of the in-chamber member includes:

applying a coating agent on the surface of the in-chamber member; and
    drying the coating agent on the surface of the in-chamber member to form the coating film thereon.

8. The method of claim 6, wherein the in-chamber member is a plasma-resistant member.

9. The method of claim 8, wherein the plasma-resistant in-chamber member includes at least one of an electrode protection member, a discharge ring, a focus ring, an insulation ring and a bellows cover.

10. The method of claim 6, wherein the resist includes a main component selected from the group consisting of a cyclized rubber-bisazide, a vinyl polycinnamate, a naphthalene compound, a phenolic resin, an acrylic resin, a novolac resin and mixtures thereof.

* * * * *